(12) United States Patent
Tabatabaei (10) Patent No.: US 6,784,740 B1
(45) Date of Patent: Aug. 31, 2004

(54) POWER AMPLIFIER (75) Inventor: Ali Tabatabaei, Sunnyvale, CA (US)

(73) Assignee: Atheros Communications, Inc., Sunnyvale, CA (US)

( * ) Notice: Subject to any disclaimer, the term of this patent is extended or adjusted under 35 U.S.C. 154(b) by 0 days.

(21) Appl. No.: 10/325,455

(22) Filed: Dec. 20, 2002

(51) Int. Cl.$^7$ ............................................... H03G 3/10
(52) U.S. Cl. ...................................... 330/279; 330/136
(58) Field of Search ................................ 330/279, 136, 330/311, 296, 295

(56) References Cited

U.S. PATENT DOCUMENTS

| | | | | |
|---|---|---|---|---|
| 3,443,241 A | * | 5/1969 | Pitzalis, Jr. | 330/285 |
| 4,591,800 A | * | 5/1986 | Opas | 330/86 |
| 5,119,042 A | * | 6/1992 | Crampton et al. | 330/295 |
| 6,252,455 B1 | * | 6/2001 | Kurby et al. | 330/136 |
| 6,556,079 B2 | * | 4/2003 | Kusunoki | 330/149 |

OTHER PUBLICATIONS

Conn, D. R.; Hemmers, R.N.; Increased Efficiency in QAM Power Amplifiers, Microwave Symposium Digest, 1998 IEEE MTT–S International, vol. 3, Jun. 7–12, 1998, pp. 1647–1650.

Ghannouchi, F. M., et al, "An Adaptive Linearizer Using Feedback and Dynamic Biasing Techniques for SSPAs", Mircrowave and Optoelectronics Conference, 1995, proceedings, 1995 SMBO/IEEE MTT–S International, vol. 1, Jul. 24–27, 1995, pp. 369–372.

Miers, T.H., et al., "A Thorough Investigation of Dynamic Bias on Linear GaAs FET Power Amplifier Performance", Microwave Symposium Digest, 1992, IEEE MTT–S International, Jun. 1–5, 1992, pp. 537–540, vol. 2.

Smely, Dieter, et al, "Improvement of Efficiency and Linearity of a Harmonic Control Amplifier by Envelope Controlled Bias Voltage", Microwave Symposium Digest, 1998 IEEE MTT–S International, vol. 3, Jun. 7–12, 1998, pp. 1667–1670.

IEEE Std 802.11a–1999.

IEEE Std 802.11b/D8.0, Sep. 2001.

* cited by examiner

Primary Examiner—Henry Choe
(74) Attorney, Agent, or Firm—Van Pelt & Yi LLP (57) ABSTRACT A system and method are disclosed for providing amplification to an input signal. The amplifier comprises an amplification stage configured to provide a gain to an input signal and to produce an amplified output, wherein the amplification stage includes an interface configured to receive a biasing voltage. The amplifier also comprises a peak detection feedback network coupled to the amplification stage configured to adjust the biasing voltage, whereby the peak detection feedback network controls the gain of the amplifier.

21 Claims, 5 Drawing Sheets

POWER AMPLIFIER

FIELD OF THE INVENTION

The present invention relates generally to power amplifiers. More specifically, a radio frequency power amplifier is disclosed.

BACKGROUND OF THE INVENTION

Power amplifiers are used in a wide range of applications. Many communications systems, particularly wireless communication systems, use power amplifiers to amplify the signal before it is transmitted.

Figure 1:
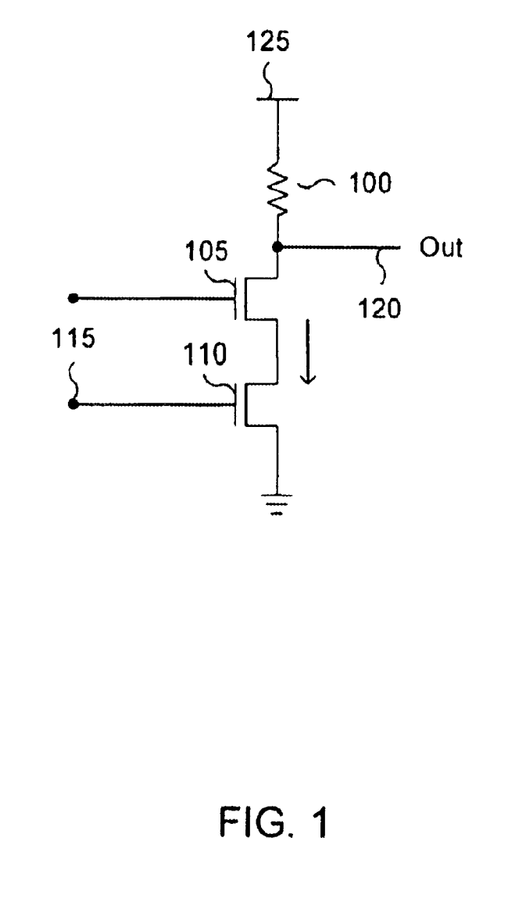
FIG. 1 is a block diagram illustrating a typical radio frequency (RF) power amplifier (PA) design.

FIG. 1 is a block diagram illustrating a typical radio frequency (RF) power amplifier (PA) design. The voltage needed by the circuit is provided by voltage supply 125. A load resistor 100 is coupled between the supply voltage and the output. Two transistors 105 and 1 10 are coupled in a cascode configuration, where transistor 110 receives an RF modulated input signal at its gate. The signal is amplified and output at terminal 120 of transistor 105. A DC biasing voltage is applied to the gate of transistor 110 at junction 115. The biasing voltage sets the linear range of the power amplifier.

To amplify an RF input signal with a non-constant envelope using a class A amplifier, the biasing voltage is typically fixed to a relatively high value so that there is a large current flowing through the circuit, enabling the power amplifier to linearly amplify an input signal of relatively high amplitude. Such a high biasing voltage leads to waste of power since a low amplitude input signal needs less DC current than a high amplitude input signal to achieve the desired gain. Moreover, as the amplitude of the input increases, the gain provided by the power amplifier decreases and the output of the higher amplitude input signal becomes compressed, causing non-linearity problems.

There have been attempts to predict the output envelope size and then set the biasing voltage accordingly. This approach can be quite complex, and sometimes introduces stability issues. It would be useful to have a stable power amplifier that has low power consumption and provides good linearity.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved power amplifier design is disclosed. The design uses a peak detection feedback network to adjust the biasing voltage, and accordingly to reduce power consumption and improve linearity. In one embodiment, the power amplifier design uses an amplifier pair with the peak detection feedback network. The design can be used for a variety of wireless transmission systems including wireless networking devices.

Figure 2A:
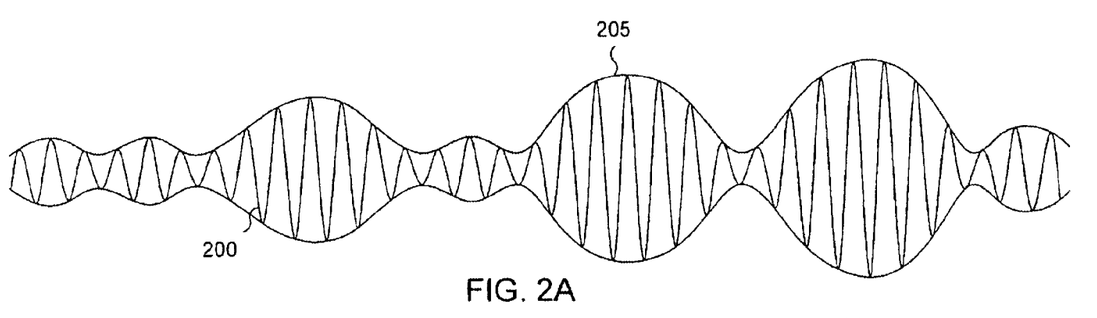
FIG. 2A illustrates an example of an RF input signal that has a non-constant envelope.
Figure 2B:
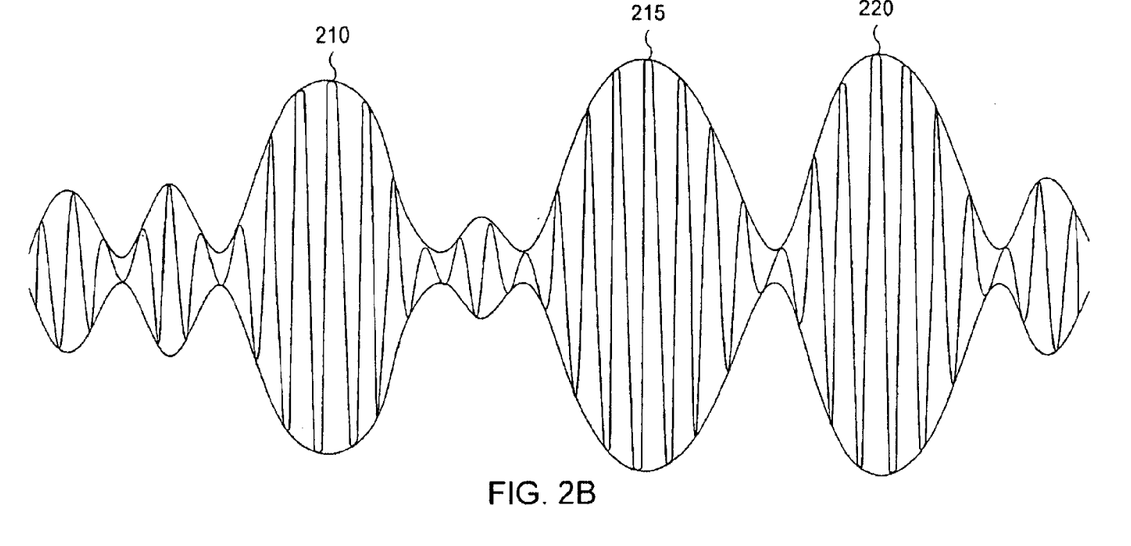
FIG. 2B illustrates an amplified output signal based on the input from FIG. 2A.

FIG. 2A illustrates an example of an RF input signal that has a non-constant envelope. Such a signal would be produced, for example, by certain types of modulation used in the IEEE 802.11a and 802.11b standards. Waveform 200 is the RF signal component that has varying peak amplitude (also referred to as strength). The peaks of the waveform create an envelope 205. FIG. 2B illustrates an amplified output signal based on the input from FIG. 2A. When the input signal is large, the output swings closer to the supply voltage and becomes compressed, as shown in sections 210, 215 and 220. Such compression is undesirable since the output is distorted in a nonlinear manner. To minimize compression, the biasing voltage should be set at a level that allows for a large current flow and maximum linear range in the output. However, when the input signal is relatively small, using a biasing voltage optimized for a large input signal generally causes unnecessary power consumption. During such periods, the biasing voltage could be set at a level that allows for a smaller current flow and still achieve the desired gain.

Figure 3:
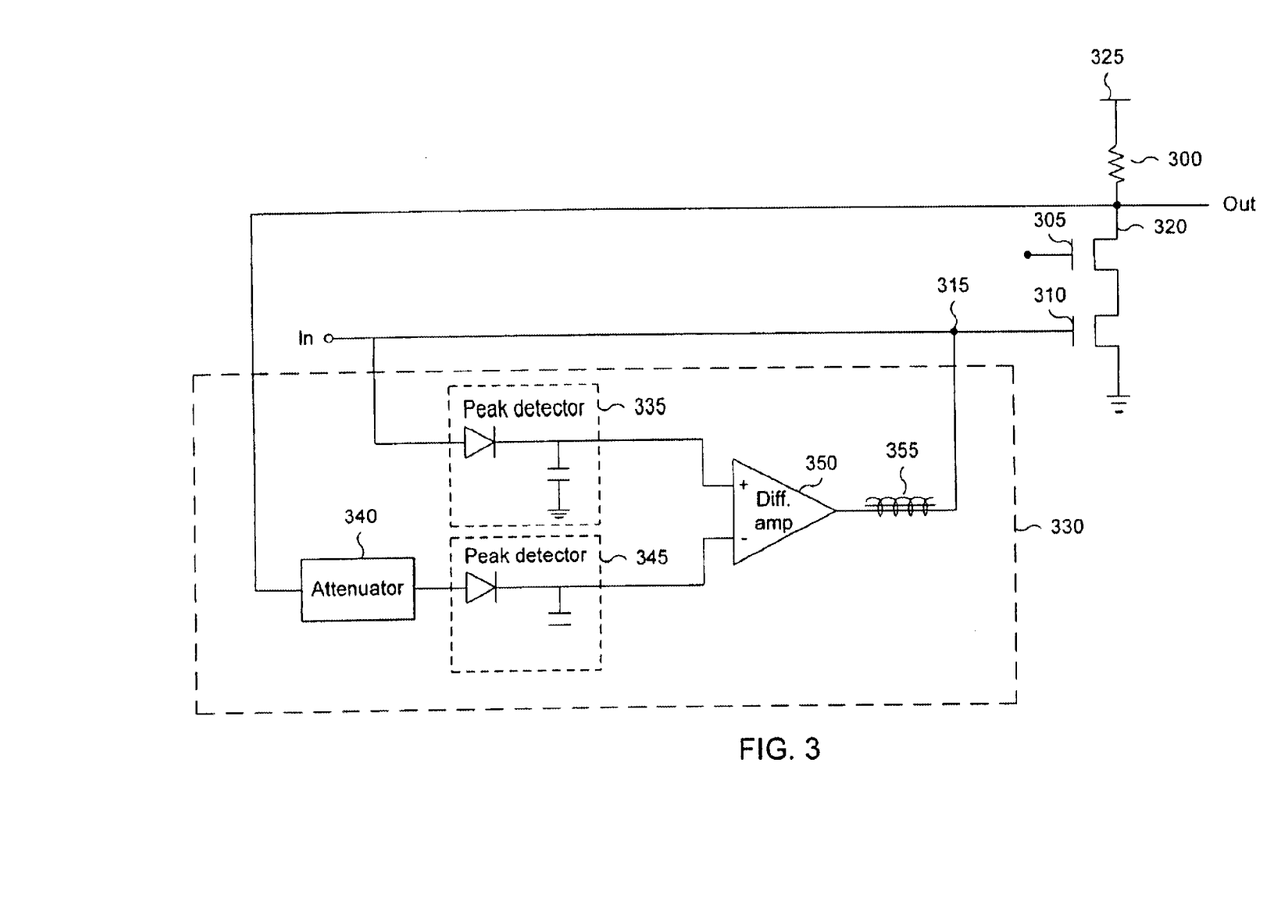
FIG. 3 illustrates an amplifier design according to the present invention.

FIG. 3 illustrates an amplifier design according to the present invention. The design utilizes a peak detection feedback network to adjust the biasing voltage and maintain a substantially constant gain. A substantially constant gain means that the output of the power amplifier has good linearity and does not get compressed very much when the output voltage is large. The amplification stage of the power amplifier includes: a voltage supply 325 for providing the voltage needed by the circuit; a load resistor 300 coupled between the supply voltage and the output; two transistors 305 and 310 coupled in a cascode configuration, where the gate of transistor 310 is connected to the power amplifier input. The signal is amplified and output at terminal 320 of transistor 305.

The input to transistor 310 includes an AC component that is the RF input signal, and a DC component that is the biasing voltage. In the embodiment shown, junction 315 is where the biasing voltage is applied. In general, an interface may be provided at any appropriate terminal to apply the biasing voltage in a manner such that the voltage may be adjusted to maintain a desired gain. The DC biasing voltage is adjusted using a peak detection feedback network 330. Peak detection feedback network 330 feeds back the gain realized by the amplifier and adjusts the biasing voltage to transistor 310 to improve the consistency of the gain even as the amplitude of the input signal varies. In one embodiment, the RF input signal is sent to peak detector (also referred to as envelope detector) 335 to detect the peak amplitude of the signal. The peak detector comprises a diode coupled with a capacitor. The detected signal is sent to the positive terminal of a differential amplifier 350. The RF output signal is sent to an attenuator 340, which attenuates the output signal by a factor proportional to the nominal gain of the power amplifier. In other words, if the power amplifier has a nominal gain of G, then the attenuator is designed to have a gain of 1/G. If the power amplifier provides an actual gain that equals the nominal gain, then the attenuated output should equal the input. If the output is compressed, then the gain is lower than nominal.

The peak amplitude of the attenuated output is detected by peak detector 345, and then sent to the negative input of differential amplifier 350. The differential amplifier amplifies the difference between the input and the attenuated output, and produces an output that is a biasing voltage at a junction 315.

If the attenuated output amplitude is less than the input amplitude, it indicates that the actual gain of the power amplifier is less than the nominal gain and the output is compressed. The RF output is fed back to the differential amplifier via the attenuator and the peak detector, and the negative input of differential amplifier 350 becomes less than the positive input. The differential amplifier amplifies the difference between its inputs and produces a higher output that pulls up the biasing voltage at junction 315. As a result, more current flows through the amplification transistors and the gain is increased.

If the attenuated output amplitude is greater than the input amplitude, it indicates that the actual gain of the power amplifier is greater than the nominal gain. The RF output is fed back to the differential amplifier, and the negative input of differential amplifier 350 becomes higher than the positive input. The differential amplifier thus produces a lower output that pulls down the biasing voltage at junction 315. As a result, less current flows through the amplification stage and the gain is reduced.

In both cases discussed above, the peak detection feedback network forces the difference between the amplifier's inputs to be close to zero. In other words, the peak detection feedback network forces the RF input and the attenuated RF output to be substantially the same, and adjusts the biasing voltage of the amplification stage to keep the gain of the amplifier approximately constant.

In the embodiment shown, the output of differential amplifier 350 is coupled to junction 315 via an RF choke 355. The RF choke is used to allow the low frequency or DC component of the output of the differential amplifier 350 to pass through, and to suppress higher frequency signals and specifically any RF signal components. In this embodiment, the RF choke is an inductor. In other embodiments, the RF choke may be implemented using other devices. In some embodiments, the RF choke is omitted.

In some embodiments, the transistors in the power amplifier are complementary metal oxide semiconductor (CMOS) transistors. In some embodiments, the transistors are bipolar transistors. In certain embodiments, the transistors are field effect transistors (FET).

Figure 4:
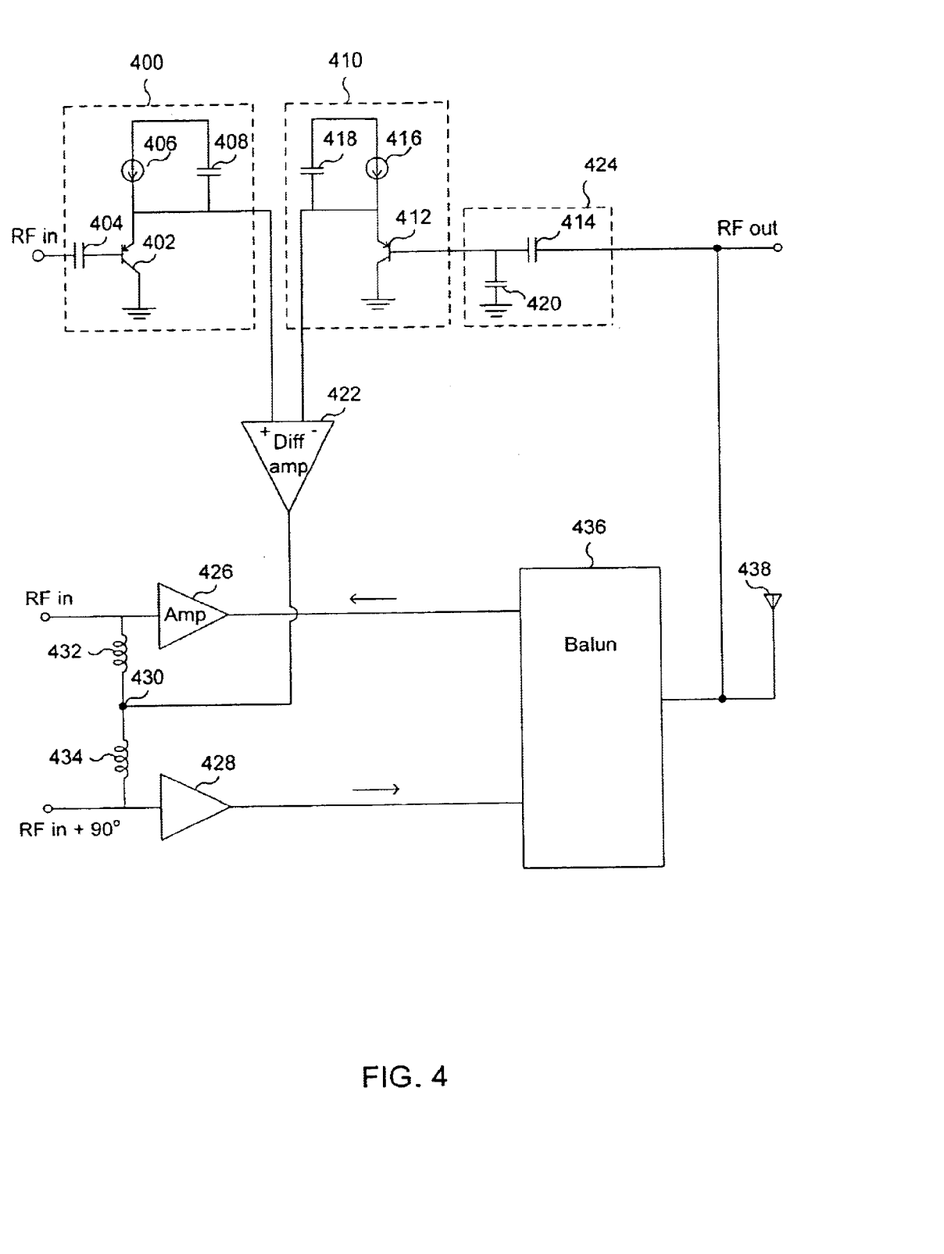
FIG. 4 is a block diagram illustrating one embodiment of a power amplifier according to the present invention.

FIG. 4 is a block diagram illustrating one embodiment of a power amplifier according to the present invention. The RF input of the power amplifier is sent to peak detector 400. In the embodiment shown, the peak detector comprises a vertical PNP transistor 402 coupled with a current source 406 and a capacitor 408. The RF input is sent to the base of transistor 402 via capacitor 404. The output of peak detector 400 is fed to the positive input terminal of differential amplifier 422.

The RF output of the power amplifier is fed back to attenuator 424, which includes capacitors 414 and 420 as shown in this embodiment. The attenuator may be implemented using other suitable circuits in other embodiments. The attenuated signal is sent to peak detector 410. In the embodiment shown, peak detector 410 comprises a PNP transistor 412 coupled with a current source 416 and a capacitor 418. The output of peak detector 410 is fed to the negative input of differential amplifier 422. Differential amplifier 422 amplifies the difference between the RF input amplitude and the attenuated RF output amplitude to produce an output that determines whether the amplifier biasing voltage should be adjusted.

In the embodiment shown, the amplification stage includes a pair of symmetrical amplifiers 426 and 428, where each of the amplifiers has a configuration similar to that of FIG. 1. Amplifier 426 receives the RF input signal and amplifier 428 receives another RF input signal that has a phase offset with the RF input signal received by amplifier 426. In this embodiment, the phase offset is 180°. A pair of connected transformers 432 and 434 are coupled with the inputs and are functionally similar to RF choke 355 in FIG. 3. The RF signals cancel each other out at junction 430 where the transformers connect and form an AC ground. The output of differential amplifier 422 sets the biasing voltage for amplifier 426 and 428 at junction 430. In the embodiment shown, a balun 436 is used to provide return current path for the outputs of amplifiers 426 and 428. In the embodiment shown, the output of the balun is the RF output of the power amplifier, and is sent to an antenna 438 for transmission.

Figure 5:
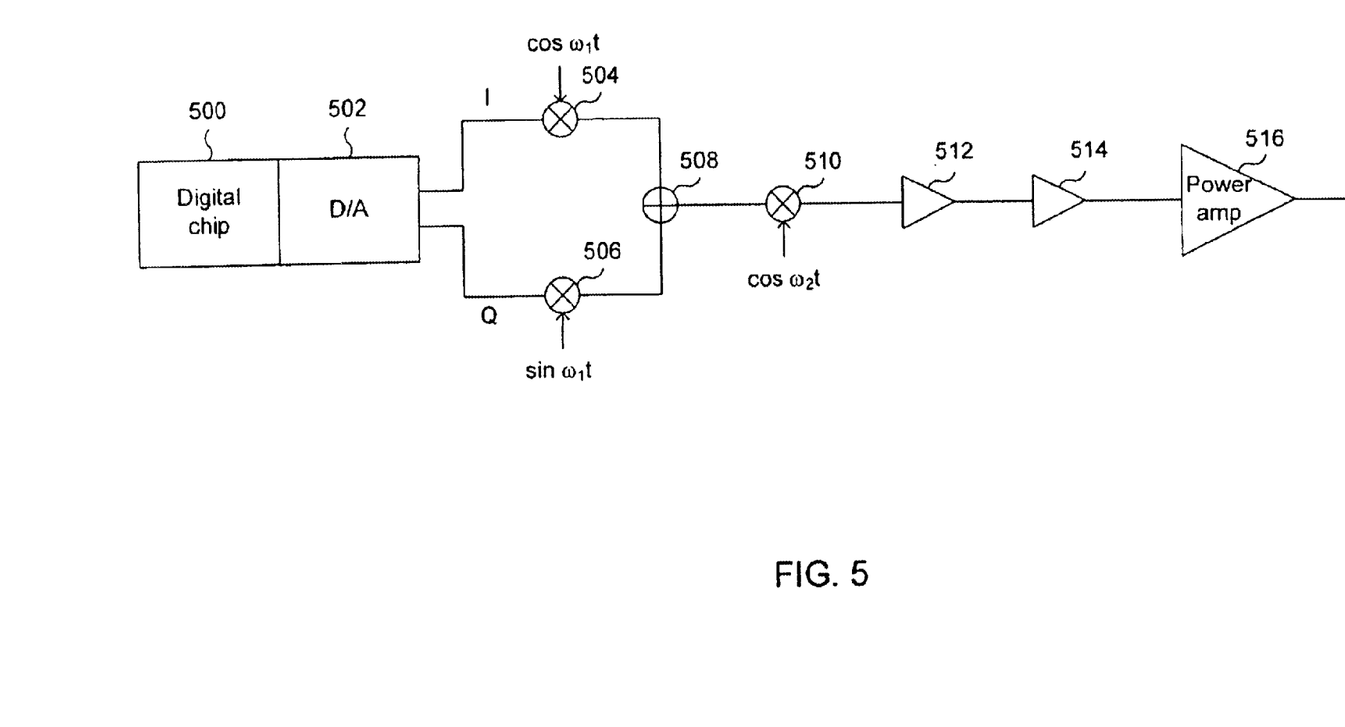
FIG. 5 is a block diagram illustrating a transceiver embodiment using a power amplifier designed according to the present invention.

FIG. 5 is a block diagram illustrating a transceiver embodiment using a power amplifier designed according to the present invention. A digital chip 500 is used to process signals to be transmitted or received. A digital to analog converter 502 is connected to the digital chip and converts the chip's digital output to analog. The in-phase (I) and quadrature (Q) components of the analog output are modulated by mixers 504 and 506, respectively. The modulated signal is combined by a combiner 508, and the combined signal is further modulated with a carrier signal by mixer 510. The modulated signal is amplified by two amplifier stages 512 and 514, before being sent to power amplifier 516. In other embodiments, the numbers of modulation and amplification stages differ, the order of the stages can also be different.

The power amplifier design according to the present invention can be used in a variety of applications, including transceivers of wireless devices. The design is well suited for non-constant envelope modulation schemes such as orthogonal frequency division multiplexing (OFDM) or code division multiple access (CDMA). In one embodiment, the power amplifier is used as the last stage of a transceiver device of a wireless networking card. The power amplifier is used in transceiver devices supporting the IEEE 802.11a and 802.11b protocols.

An improved power amplifier design is disclosed. The design uses a peak detection feedback network to adjust the biasing voltage to reduce power consumption and improve linearity.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. An amplifier comprising:
   an amplification stage configured to provide a gain to an input signal and to produce an amplified output; wherein the amplification stage includes an interface configured to receive a biasing voltage; and
   a peak detection feedback network coupled to the amplification stage configured to adjust the biasing voltage; wherein:
      the peak detection feedback network controls the gain based on feedback of the amplified output;
      the amplification stage includes a first transistor coupled with a second transistor and wherein the first transistor and second transistor are connected in a cascode configuration and;
      the first transistor includes an input interface configured to receive the input signal and the second transistor includes an output interface configured to send the amplified output.

2. An amplifier as recited in claim 1 wherein the peak detection feedback network controls the gain to be approximately constant within the amplifier's operating range.

3. An amplifier as recited in claim 1 wherein the peak detection feedback network controls the gain to be substantially the same as a nominal gain of the amplifier.

4. An amplifier as recited in claim 1 wherein the peak detection feedback network controls the gain by comparing an attenuated output with the input signal.

5. An amplifier as recited in claim 1 wherein the power amplifier is a radio frequency power amplifier.

6. An amplifier as recited in claim 1 wherein the amplification stage includes a first transistor coupled with a second transistor.

7. An amplifier as recited in claim 1 wherein:
   the amplification stage includes a first transistor coupled with a second transistor; and
   the interface configured to receive the biasing voltage is coupled to the first transistor.

8. An amplifier as recited in claim 1 wherein:
   the amplification stage includes a first transistor coupled with a second transistor; and
   the first and second transistors are field effect transistors (FET), complementary metal oxide semiconductor (CMOS) transistors, or bipolar transistors.

9. An amplifier comprising:
   an amplification stage configured to provide a gain to an input signal and to produce an amplified output; wherein the amplification stage includes an interface configured to receive a biasing voltage; and
   a peak detection feedback network coupled to the amplification stage configured to adjust the biasing voltage; wherein:
      the peak detection feedback network controls the gain based on feedback of the amplified output;
      the amplification stage includes a first transistor coupled with a second transistor and wherein the first transistor and second transistor are connected in a cascode configuration;
      the first transistor includes an input interface configured to receive the input signal and the second transistor includes an output interface configured to send the amplified output; and
      the peak detection feedback network is coupled between the input interface and the output interface.

10. An amplifier as recited in claim 1 wherein the peak detection feedback network includes:
    a differential amplifier configured to amplify a difference between an input amplitude and an output amplitude.

11. An amplifier as recited in claim 1 wherein the peak detection feedback network includes:
    an input peak detector configured to detect an input amplitude;
    an attenuator configured to attenuate the amplified output;
    an output peak detector configured to detect the attenuated output amplitude;
    a differential amplifier configured to amplify the difference between the input amplitude and the attenuated output amplitude; wherein
    the differential amplifier is coupled to the interface configured to receive a biasing voltage.

12. An amplifier as recited in claim 1 wherein the peak detection feedback network includes:
    an input peak detector configured to detect an input amplitude;
    an attenuator configured to attenuate the amplified output;
    an output peak detector configured to detect the attenuated output amplitude;
    a differential amplifier configured to amplify the difference between the input amplitude and the attenuated output amplitude; wherein
    the differential amplifier is coupled to the interface configured to receive a biasing voltage; and
    the amplifier further includes a radio frequency choke coupled to the power amplifier.

13. An amplifier as recited in claim 1 wherein the peak detection feedback network includes:
    an input peak detector configured to detect an input amplitude;
    an attenuator configured to attenuate the amplified output;
    an output peak detector configured to detect the attenuated output amplitude;
    a differential amplifier configured to amplify the difference between the input amplitude and the attenuated output amplitude; wherein:
       the differential amplifier is coupled to the interface configured to receive a biasing voltage;
       the input peak detector includes a vertical PNP transistor; and
       the output peak detector includes a vertical PNP transistor.

14. An amplifier comprising:
    an amplification stage configured to provide a gain to an input signal and to produce an amplified output;

wherein the amplification stage includes an interface configured to receive a biasing voltage a first transistor and second transistor connected in a cascode configuration; and a peak detection feedback network coupled to the amplification stage configured to adjust the biasing voltage;

wherein the peak detection feedback network controls the gain based on feedback of the amplified output; and the peak detection feedback network includes:

an input peak detector configured to detect an input amplitude;

an attenuator configured to attenuate the amplified output;

an output peak detector configured to detect the attenuated output amplitude;

a differential amplifier configured to amplify the difference between the input amplitude and the attenuated output amplitude; wherein:

the differential amplifier is coupled to the interface configured to receive a biasing voltage;

the input peak detector includes a diode and a capacitor coupled to the diode; and the output peak detector includes a diode and a capacitor coupled to the diode.

15. An amplifier comprising:

an amplification stage configured to provide a Rain to an input signal and to produce an amplified output; wherein the amplification stage includes an interface configured to receive a biasing voltage; and a peak detection feedback network coupled to the amplification stage configured to adjust the biasing voltage;

wherein the peak detection feedback network controls the gain based on feedback of the amplified output; and the amplification stage comprises a pair of symmetrical amplifiers including a first symmetrical amplifier and a second symmetrical amplifier; wherein:

a first radio frequency input is applied to the first symmetrical amplifier;

a second radio frequency input is applied to the second symmetrical amplifier; and the second radio frequency input has a phase offset from the first radio frequency input.

16. An amplifier comprising:

an amplification stage configured to provide a gain to an input signal and to produce an amplified output; wherein the amplification stage includes an interface configured to receive a biasing voltage; and a peak detection feedback network coupled to the amplification stage configured to adjust the biasing voltage;

wherein the peak detection feedback network controls the gain based on feedback of the amplified output; and the amplification stage comprises a pair of symmetrical amplifiers including a first symmetrical amplifier and a second symmetrical amplifier; wherein a first radio frequency input is applied to the first symmetrical amplifier; a second radio frequency input is applied to the second symmetrical amplifier; the second radio frequency input has a phase offset from the first radio frequency input; the first symmetrical amplifier and the second symmetrical amplifier are coupled via a plurality of transformers; and the peak detection feedback network is coupled to the first and second amplification stages at a junction that is an AC ground.

17. An amplifier as recited in claim 1 wherein the power amplifier is included in a wireless transceiver device.

18. An amplifier as recited in claim 1 wherein the power amplifier is included in a wireless transceiver device supporting non-constant envelope modulation schemes.

19. An amplifier as recited in claim 1 wherein the power amplifier is included in a wireless transceiver device supporting orthogonal frequency division multiplexing (OFDM).

20. An amplifier as recited in claim 1 wherein the power amplifier is included in a wireless transceiver device supporting code division multiple access (CDMA).

21. An amplifier as recited in claim 1 wherein the power amplifier is included in a wireless transceiver device supporting IEEE 802.11a protocol or IEEE802.11b protocol.

* * * * *

UNITED STATES PATENT AND TRADEMARK OFFICE
CERTIFICATE OF CORRECTION

| | | |
|---|---|---|
| PATENT NO. | : 6,784,740 B1 | Page 1 of 1 |
| APPLICATION NO. | : 10/325455 | |
| DATED | : August 31, 2004 | |
| INVENTOR(S) | : Ali Tabatabaei | |

It is certified that error appears in the above-identified patent and that said Letters Patent is hereby corrected as shown below:

Column 7, line 2 delete "voltage a first" and insert -- voltage, a first --

Column 7, line 27 delete "a Rain to" and insert -- a gain to --

Signed and Sealed this

Twenty-ninth Day of September, 2009

David J. Kappos
*Director of the United States Patent and Trademark Office*